United States Patent
Zhao et al.

(10) Patent No.: US 9,673,788 B2
(45) Date of Patent: Jun. 6, 2017

(54) INPUT BUFFER WITH SELECTABLE HYSTERESIS AND SPEED

(71) Applicant: FREESCALE SEMICONDUCTOR, INC., Austin, TX (US)

(72) Inventors: Yi Zhao, Tianjin (CN); Dongling Zhang, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/235,074

(22) Filed: Aug. 11, 2016

(65) Prior Publication Data

US 2017/0070213 A1  Mar. 9, 2017

(30) Foreign Application Priority Data

Sep. 8, 2015 (CN) .......................... 2015 1 0723963

(51) Int. Cl.
H03K 3/356 (2006.01)
H03K 3/012 (2006.01)
H03K 3/3565 (2006.01)

(52) U.S. Cl.
CPC ........... *H03K 3/012* (2013.01); *H03K 3/3565* (2013.01)

(58) Field of Classification Search
CPC .................................................... H03K 3/3565
USPC ................................... 326/87; 327/205, 206
See application file for complete search history.

(56) References Cited

U.S. PATENT DOCUMENTS

| | | | |
|---|---|---|---|
| 4,071,784 A | 1/1978 | Maeder | |
| 5,349,246 A | 9/1994 | McClure | |
| 6,043,683 A * | 3/2000 | Bae ................ | H03K 19/018585 326/30 |
| 6,124,733 A | 9/2000 | Sharpe-Geisler | |
| 6,188,244 B1 | 2/2001 | Joo | |
| 6,275,082 B1 | 8/2001 | Kiehl | |
| 6,433,602 B1 * | 8/2002 | Lall ...................... | H03K 3/3565 327/205 |
| 6,975,153 B2 | 12/2005 | Hinterscher | |
| 7,035,148 B2 * | 4/2006 | Chung ................. | G11C 7/1051 326/87 |
| 7,126,389 B1 * | 10/2006 | McRae ................ | H03K 17/167 326/85 |
| 7,420,394 B2 | 9/2008 | Kase | |
| 7,764,101 B2 * | 7/2010 | Wu ....................... | H03K 3/3565 327/205 |
| 8,816,740 B1 * | 8/2014 | Seshita ................ | H03K 3/3565 327/205 |

* cited by examiner

*Primary Examiner* — Jeffrey Zweizig
(74) *Attorney, Agent, or Firm* — Charles E. Bergere

(57) ABSTRACT

A buffer provides a signal at an output node as a function of an input signal. First and second buffer stages have respective current conduction paths for asserting the output signal. An enabling element selectively enables the second buffer stage in response to assertion of an enabling signal in a state where the first and second buffer stages are both simultaneously enabled. The first buffer stage has hysteresis feedback paths from the output node for providing hysteresis in the buffer response. The hysteresis is smaller when the first and second buffer stages are both enabled than when only the first buffer stage is enabled. The response of the second buffer stage to the input signal, when enabled, is faster than the first buffer stage.

20 Claims, 2 Drawing Sheets

INPUT BUFFER WITH SELECTABLE HYSTERESIS AND SPEED

BACKGROUND

The present invention is directed to integrated circuits and, more particularly, to an input buffer with selectable hysteresis and speed.

An input buffer is used in integrated circuits (ICs) to provide an interface between an external source of an input signal and an internal module. The source of the input signal may be connected to an input pad or an input/output (I/O) pad. In the case where the buffer is connected to an I/O pad, it is commonly desirable for the buffer to be enabled when the I/O pad is used as an input but disabled when the pad is used as an output.

Input signals from an external source are often subject to noise, especially caused by interference induced in the connection between the external source and the input pad. Typically, an input buffer is designed with transfer characteristics that exhibit hysteresis. Hysteresis of the transfer characteristics of an input buffer makes a change in the output signal of the buffer dependent on the history of past values of the input signal. Accordingly, if a first change of the input signal initially produces assertion of the output signal, a second and opposite change of the input signal in order to de-assert the output signal will have to be of bigger magnitude. The hysteresis has the effect of filtering noise of small amplitude compared to the input signal.

The transfer characteristics that confer hysteresis tend to conflict with the characteristics that confer fast operating speed. Also, higher hysteresis may be desirable in a slower speed buffer. For a given input pad or I/O pad, it may be desirable to select by a control signal whether the transfer characteristics have higher hysteresis and slower speed, or higher speed and lower hysteresis. It is possible to achieve the selection of transfer characteristics by providing two input buffers that can be selected alternatively by the control signal enabling one and disabling the other. However, such an approach tends to consume area and increase cost.

It would be advantageous to have an input buffer having alternative hysteresis and operating speed characteristics that can be selected by a control signal.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
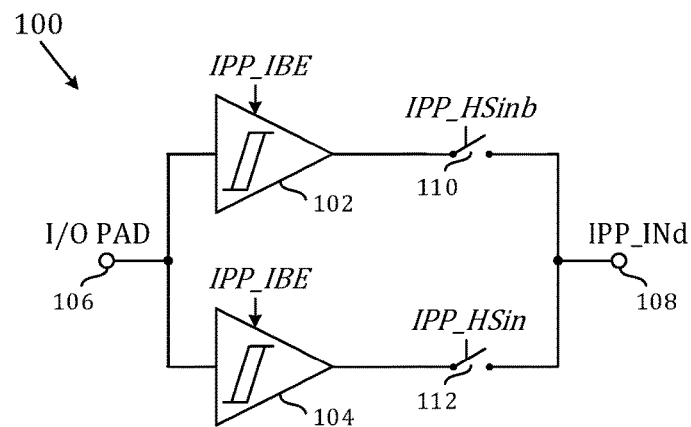
FIG. 1 is a schematic block diagram of a conventional input/output (I/O) buffer module having two input buffers that can be selected alternatively by a control signal enabling one and disabling the other.

FIG. 1 illustrates a conventional input/output (I/O) buffer module 100 having two input buffers 102, 104 that have different transfer characteristics with respective speeds and hysteresis. The inputs of the input buffers 102, 104 are connected to an input/output (I/O) pad 106 to receive an input signal from an external source (not shown). The input buffers 102, 104 can be enabled by an input path input buffer enable signal IPP_IBE to transfer the input signal into the IC. The outputs of the input buffers 102, 104 are connected to a node 108 by respective switches 110 and 112. The output signal OUT of one or other of the input buffers 102, 104 can be selected alternatively and passed to the node 108 by complementary control signals IPP_HSin and IPP_HSinb closing one the switches 110 and 112 and opening the other. This configuration offers a selection of transfer characteristics with higher hysteresis and slower speed, or higher speed and lower hysteresis. However, this configuration has two complete input buffers, which wastes area of the IC, and increases its cost.

Figure 2:
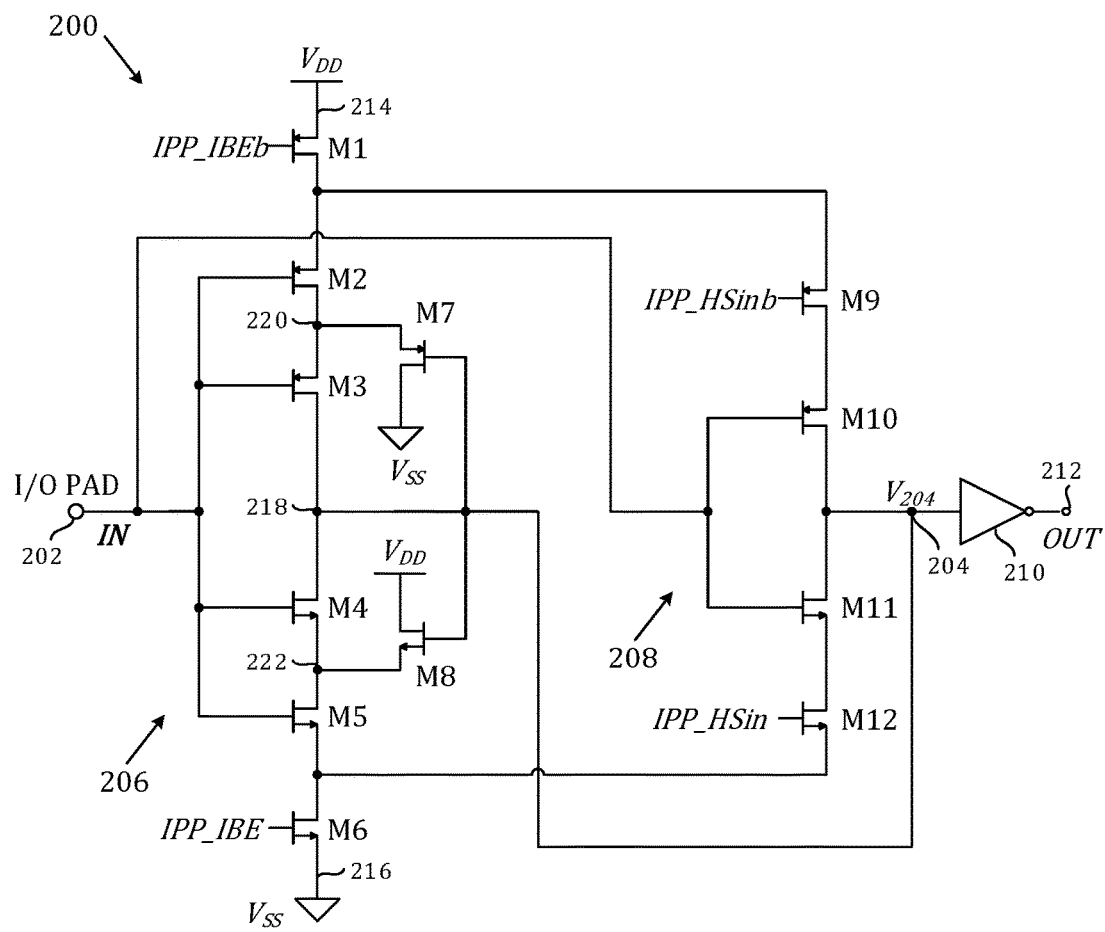
FIG. 2 is a schematic circuit diagram of a buffer in accordance with an embodiment of the invention.

FIG. 2 illustrates a buffer 200 in accordance with an embodiment of the invention. The buffer 200 receives a first signal IN at a first node 202 (which may be the I/O pad 106) from an external source (not shown), and provides a second signal $V_{204}$ at a node 204 as a function of the first signal IN. The buffer 200 comprises first and second buffer stages 206, 208 having respective current conduction paths for asserting the second signal $V_{204}$ at the second node as a function of the first signal IN. An inverter 210 is connected to the second node 204 to provide the buffer output signal OUT at a buffer output node 212 as a function of the second signal $V_{204}$. The buffer 200 also comprises a first enabling element M9, M12 for selectively enabling the second buffer stage 208 in response to assertion of a first enabling signal IPP_HSin, IPP_HSinb in a state where the first and second buffer stages are both simultaneously enabled. The first buffer stage 206 has at least one hysteresis feedback path M7, M8 from the second node 204 for providing hysteresis in the response of the second signal $V_{204}$ to the first signal IN.

The buffer 200 presents a hysteresis that is smaller when the first and second buffer stages 206 and 208 are both enabled than when the first buffer stage 206 is enabled and the second buffer stage 208 is disabled.

The response of the second buffer stage 208 to the first signal IN, when enabled, is faster than the response of the first buffer stage 206.

In the buffer 200, the first node 202 is connected to an I/O pad, and the buffer 200 has a second enabling element M1, M6 for selectively enabling the first and second buffer stages 206 and 208 in response to assertion of a second enabling signal IPP_IBE, IPP_IBEb. The second enabling signal IPP_IBE, IPP_IBEb is an input path input buffer enabling signal that enables the buffer 200 when the I/O pad is used for input and disables the buffer 200 when the I/O pad is used for output.

The first and second buffer stages 206 and 208 may comprise pairs of transistors M2 to M5, and M10 and M11 of first and second complementary conductivity types (n-type and p-type). The transistors M10 and M11 of the second buffer stage 208 of each conductivity type preferably are larger than the transistor elements M2 to M5 of the first buffer stage 206 of the same conductivity type so that the response of the second buffer stage 208, when enabled, is faster than the response of the first buffer stage 206. In one embodiment of the buffer 200, the transistors and enabling elements M1 to M12 (and the inverter 210) are implemented in complementary metal-oxide semiconductor (CMOS) technology, and the relative sizes of the MOSFETs are as follows:

$M1=M6=M9=M12$ $M10=3*M2=3*M3$ $M11=3*M4=3*M5$

CMOS technology uses complementary and symmetrical pairs of p-type and n-type metal oxide semiconductor field effect transistors (MOSFETs). It will be appreciated that the gates of the MOSFETs may be of other materials, such as polysilicon, instead of metal, and that the gate insulator of the MOSFETs may be of other materials, such as nitride or high-k insulator, instead of or as well as oxide.

The buffer 200 offers a selection of transfer characteristics with higher hysteresis and slower speed, or higher speed and lower hysteresis by the state of the enabling signal IPP_HSin, IPP_HSinb with a simpler structure of the second buffer stage 208, by reusing without duplicating the hysteresis feedback path M7, M8 and the inverter 210.

The enabling elements M9, M12 and M1, M6 may comprise switches controlled by the enabling signals IPP_HSin, IPP_HSinb and IPP_IBE, IPP_IBEb and connected in series with the current conduction paths of the first and second buffer stages 206 and 208. The enabling element M9, M12 for selectively enabling the second buffer stage 208 may be connected in series between the current conduction path of the second buffer stage 208 and the second enabling element M1, M6.

The first and second buffer stages 206 and 208 may comprise first and second logic inverters M2 to M5, and M10 and M11 respectively, and power supply rails 214, 216 at different voltages $V_{DD}$ and $V_{SS}$. In one embodiment, the power supply rail 216 is a ground rail at voltage $V_{SS}=0V$. Each of the inverters may have first and second complementary legs M2, M3 and M4, M5, and M10 and M11 connected in series in the current conduction paths between the second node 204 and respective power supply rails 214, 216. Each of the inverters has pairs of transistors of first and second complementary conductivity types connected in series to conduct current in the first and second legs respectively, the complementary pairs of transistors being controlled by the first signal.

The first inverter may have at least two complementary pairs of the transistors M2, M5 and M3, M4 connected to conduct current in series in the legs of the first inverter. The transistors of the first (M2, M3) and second (M4, M5) conductivity types are connected together in series in the first and second legs at first and second feedback nodes 220 and 222 respectively. The hysteresis feedback path comprises first and second biasing elements M7 and M8 for biasing the first and second feedback nodes 220 and 222 respectively as complementary functions of the second signal $V_{204}$. Accordingly, when the second signal $V_{204}$ is asserted one of the first and second biasing elements M7 and M8 is activated and the other is deactivated.

The enabling element for selectively enabling the second buffer stage 208 may comprise complementary switches M9 and M12 controlled by the enabling signals IPP_HSin, IPP_HSinb and connected in series in the first and second legs of the second inverter M10 and M11. The first node 202 is connected to an I/O pad, and the buffer 200 has further complementary switches M1 and M6 controlled by a further enabling signal IPP_IBE, IPP_IBEb and connected in series with both the current conduction paths of the first and second buffer stages 206 and 208 for selectively enabling the first and second buffer stages in response to assertion of the further enabling signal IPP_IBE, IPP_IBEb.

The hysteresis feedback path M7, M8 of the first buffer stage provides hysteresis of the buffer 200 when both the second buffer stage 208 and the first buffer stage 206 are enabled. No additional hysteresis feedback path need be provided in the second buffer stage 208. The buffer 200 will reuse the first buffer stage 206 together with the second buffer stage 208 in the high speed, low hysteresis mode.

In more detail, the first buffer stage 206 has PMOS transistors M2 and M3 and NMOS transistors M4 and M5. The source-drain paths of M2 to M5 are connected in series with the source-drain paths of M1 and M6 between the power supply rails 214 and 216 in the current conduction path of the inverter of the first buffer stage 206. The source of M2 is connected to the drain of M1, the drain of M2 and the source of M3 are connected to the feedback node 220, and the drain of M3 is connected to the node 218. The source of M5 is connected to the drain of M6, the drain of M5 and the source of M4 are connected to the feedback node 222, and the drain of M4 is connected to the node 218. The node 218 is connected to the second node 204. The gates of M2 to M5 are connected together and to the first node 202.

The second buffer stage 208 has a PMOS transistor M10 and a NMOS transistor M11. The source-drain paths of M10 and M11 are connected in series with the source-drain paths of M9 and M12 and through the source-drain paths of M1 and M6 to the power supply rails 214 and 216 in the current conduction path of the inverter of the second buffer stage 208. The source of M10 is connected to the drain of M9 and the drain of M10 is connected to the second node 204. The source of M11 is connected to the drain of M12 and the drain of M11 is connected to the node 204. The gates of M10 and M11 are connected together and to the first node 202.

In operation, when the buffer enabling signal IPP_IBE is low (i.e., logic 0), and the complement IPP_IBEb is high (i.e., logic 1), the buffer 200 is disconnected from the power supply rails 214 and 216 by the switches M1 and M6 and is disabled.

When the buffer enabling signal IPP_IBE is high, and the complement IPP_IBEb is low, the buffer 200 is connected to the power supply rails 214 and 216 by the switches M1 and M6 and at least the first buffer stage 206 is enabled. When the high speed enable signal IPP_HSin is high, and the complement IPP_HSinb is low, the second buffer stage 208 is connected to the power supply rails 214 and 216 through the switches M9, M12 and M1, M6 and is enabled in addition to the first buffer stage 206. When the high speed enable signal IPP_HSin is low, and the complement IPP_HSinb is high, the second buffer stage 208 is disconnected from the power supply rails 214 and 216 by the switches M9, M12 and is disabled, even when the switches M1, M6 enable the first buffer stage 206.

Figure 3:
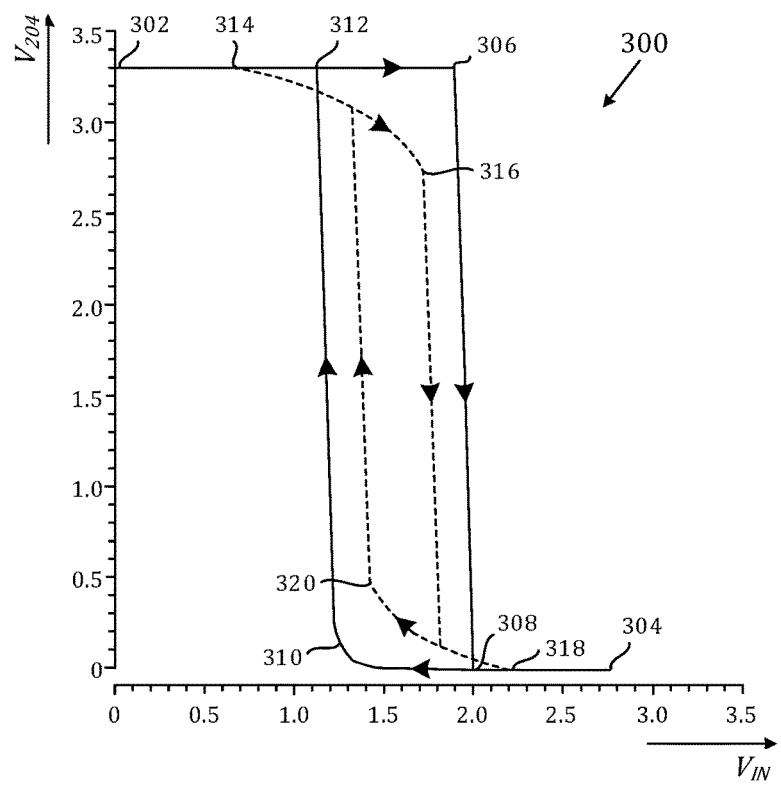
FIG. 3 is a graph of output signals appearing in operation of the buffer of FIG. 2 against corresponding input signals.
Figure 4:
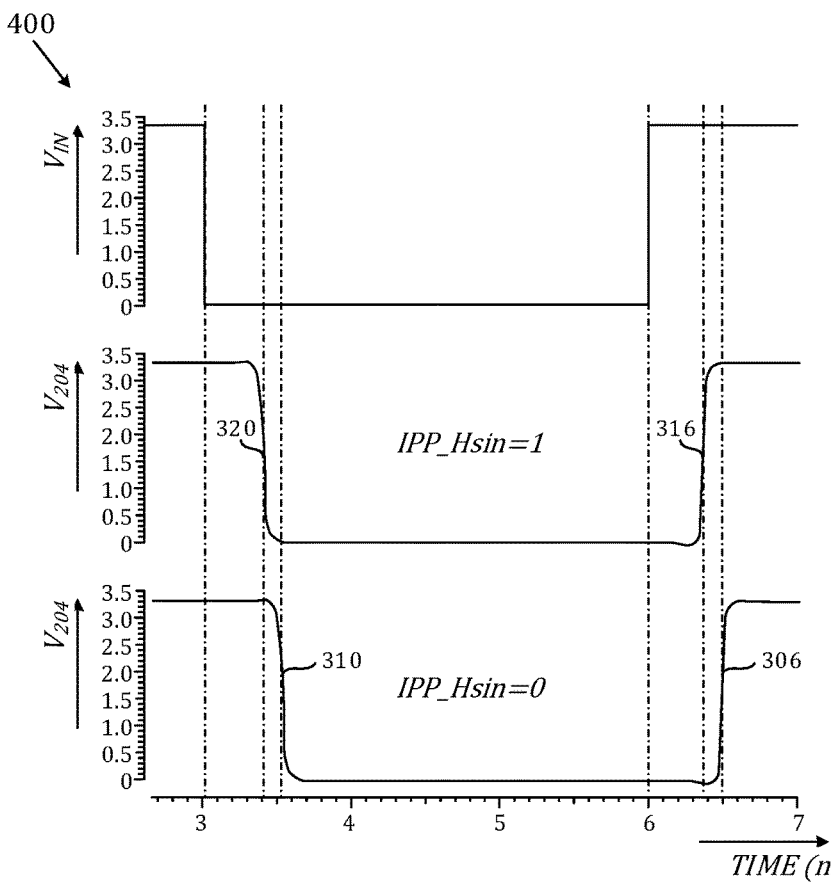
FIG. 4 is a graph against time of signals appearing in operation of the buffer of FIG. 2.

FIGS. 3 and 4 illustrate signals appearing in operation of the buffer 200 when the buffer enable signal IPP_IBE is high, and the complement IPP_IBEb is low, the buffer 200 is connected to the power supply rails 214 and 216 by the switches M1, M6 and is enabled. FIG. 3 shows graphs 300 of the variation of the signal $V_{204}$ at the node 204 as a function of the first signal IN when the high speed enabling signal IPP_HSin is low and high (its complement IPP_HSinb being respectively high and low).

The voltage of the signal $V_{204}$ is shown in full lines in the graph 300 for the case where the second buffer stage 208 is disabled when the high speed enabling signal IPP_HSin is low and its complement IPP_HSinb is high on the switches M9, M12. When the first signal IN is low at 302, the NMOS transistors M4, M5 are OFF, and the PMOS transistors M2 and M3 are ON, pulling the nodes 218 and 204 up towards the power supply voltage $V_{DD}$. The p-type hysteresis feedback MOSFET M7 is OFF, but the n-type hysteresis feedback MOSFET M8 is ON, pulling the node 222 up to a voltage ($V_{DD}$–$V_{DSM8}$), where $V_{DSM8}$ is the drain-source voltage of the MOSFET M8. When the first signal IN is high (1) at 304, the PMOSFETs M2 and M3 are OFF and the NMOSFETs M4, M5 are ON, pulling the nodes 218 and 204 down towards ground. The n-type hysteresis feedback MOSFET M8 is OFF, but the p-type hysteresis feedback MOSFET M7 is ON, pulling the node 220 down towards ground to a voltage $V_{DSM7}$, where $V_{DSM7}$ is the drain-source voltage of the MOSFET M7. When the first signal IN increases from 0V at 302 towards its high level, of 2.8V in this embodiment, it must reach a voltage of ($V_{DD}$–$V_{DSM8}$+$V_{TN}$) at 306, where $V_{TN}$ is the threshold voltage of the NMOSFET M4, before the first buffer stage 206 changes state, the PMOSFETs M2 and M3 turn OFF and the NMOSFETs M4, M5 turn ON, and the nodes 218 and 204 are pulled down towards ground at 308. Conversely, when the first signal IN decreases from its high level at 304, of 2.8V in this example, towards 0V at 302, it must reach a voltage of ($V_{DSM7}$–$V_{TP}$) at 310, where $V_{TP}$ is the threshold voltage of the PMOSFET M3, before the first buffer stage 206 changes state again, the p-type MOSFETs M2 and M3 turn ON and the NMOSFETs M4, M5 turn OFF, and the nodes 218 and 204 are pulled up towards the power supply voltage $V_{DD}$ at 312.

The voltage of the signal $V_{204}$ is shown in dashed lines for the case where both the first and second buffer stages 206 and 208 are enabled due to assertion of the enabling signal on the switch MOSFETs M9, M12, where IPP_HSin is high and its complement IPP_HSinb is low. When the first signal IN is low at 302, the NMOSFETs M4, M5 and M11 are OFF, and the PMOSFETs M2, M3 and M10 are ON, pulling the nodes 218 and 204 up towards the power supply voltage $V_{DD}$. The n-type hysteresis feedback MOSFET M8 is ON, pulling the node 222 up to the voltage ($V_{DD}$–$V_{DSM8}$). When the first signal IN is high at 304, the PMOSFETs M2, M3 and M10 are OFF and the n-NMOSFETs M4, M5 and M11 are ON, pulling the nodes 218 and 204 down towards ground. The p-type hysteresis feedback MOSFET M7 is ON, pulling the node 220 down towards ground to the voltage $V_{DSM7}$. When both the buffer stages 206 and 208 are enabled, the first signal IN controls two current conducting paths, through the first stage 206, which still generates hysteresis, and the second buffer stage 208, which has faster response time. When the first signal IN increases from 0V at 302 towards its high level, of 2.8V in this example, the second buffer stage 208 is unaffected by the feedback to the node 222 of the hysteresis feedback MOSFET M8. The n-type MOSFET M11 turns ON once its gate reaches its threshold voltage at 314, before the MOSFETs M4 and M5 of the first buffer stage 206 start to turn ON, and starts to pull the nodes 218 and 204 down towards ground at 308. The gate voltage of the n-type hysteresis feedback MOSFET M8 is reduced, increasing the drain-source voltage $V_{DSM8}$ of M8 and reducing the voltage of ($V_{DD}$–$V_{DSM8}$+$V_{TN}$) at 316 that the first signal IN at the gate of M4 must reach before the first buffer stage 206 changes state as well as the second buffer stage 208. The amount of hysteresis is reduced and M4 turns on more easily due to the second buffer stage 208 changing state first. Conversely, when the first signal IN decreases from its high level at 304, of 2.8V in this example, towards 0V at 302, the PMOSFET M10 turns ON once its gate reaches its threshold voltage at 318, before M2 and M3 of the first buffer stage 206 start to turn ON. The MOSFET M10 starts to pull the nodes 218 and 204 up towards the power supply voltage $V_{DD}$. The gate voltage of the p-type hysteresis feedback MOSFET M8 is increased, increasing the drain-source voltage $V_{DSM7}$ of the MOSFET M7 and increasing the voltage of ($V_{DSM7}$–$V_{TN}$) below which, at 320, the first signal IN can make the first buffer stage 206 change state as well as the second buffer stage 208. The amount of hysteresis is reduced and the MOSFET M3 turns on more easily due to the second buffer stage 208 changing state first.

FIG. 4 is a graph 400 of the voltage of the signal $V_{204}$ against time, as a function of the first signal IN, for the two cases where the second buffer stage 208 is enabled (IPP_HSin=1) and is disabled (IPP_HSin=0). It will be seen that the response of the buffer 200 to a change in the first signal IN is substantially faster when the second buffer stage 208 is enabled than when it is disabled.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A buffer for providing a buffer output signal as a function of a first signal at a first node from an external source, the buffer comprising:
    first and second buffer stages having respective current conduction paths for asserting a second signal at a second node as a function of the first signal; and
    a first enabling element for selectively enabling the second buffer stage in response to assertion of a first enabling signal in a state where the first and second buffer stages are both simultaneously enabled;
    wherein the first buffer stage has at least one hysteresis feedback path from the second node for providing hysteresis in the response of the second signal to the first signal; and
    wherein the buffer presents a hysteresis that is smaller when the first and second buffer stages are both enabled than when the first buffer stage is enabled and the second buffer stage is disabled.

2. The buffer of claim 1, wherein the first node is connected to an input/output (I/O) pad, and the buffer has a second enabling element for selectively enabling the first and second buffer stages in response to assertion of a second enabling signal.

3. The buffer of claim 2, wherein the first and second enabling elements comprise switches controlled by the first and second enabling signals and connected in series with the current conduction paths of the first and second buffer stages, and wherein the first enabling element is connected in series between the current conduction path of the second buffer stage and the second enabling element.

4. The buffer of claim 1, wherein:
    the first and second buffer stages comprise first and second logic inverters respectively, and power supply rails at different voltages,
    each of the inverters has first and second complementary legs connected in series in the current conduction paths between the second node and respective power supply rails, and
    each of the inverters has pairs of transistors of first and second complementary conductivity types connected in series to conduct current in the first and second legs respectively, the complementary pairs of transistors being controlled by the first signal.

5. The buffer of claim 4, wherein:
    the first inverter has at least two complementary pairs of the transistors connected to conduct current in series in the legs of the first inverter, with transistors of the first and second conductivity types connected together in series in the first and second legs at first and second feedback nodes respectively, and
    the hysteresis feedback path comprises first and second biasing elements for biasing the first and second feedback nodes respectively as complementary functions of the second signal.

6. The buffer of claim 4, wherein:
    the enabling element for selectively enabling the second buffer stage comprises complementary switches controlled by the first enabling signal and connected in series in the first and second legs of the second inverter,
    the first node is connected to an input/output (I/O) pad, and
    the buffer has further complementary switches controlled by a further enabling signal and connected in series with both the current conduction paths of the first and second buffer stages for selectively enabling the first and second buffer stages in response to assertion of the further enabling signal.

7. The buffer of claim 1, wherein the hysteresis feedback path of the first buffer stage provides hysteresis of the buffer when both the second buffer stage and the first buffer stage are enabled.

8. The buffer of claim 1, further comprising an inverter connected to the second node that provides the buffer output signal as a function of the second signal.

9. A buffer for providing a buffer output signal as a function of a first signal at a first node from an external source, the buffer comprising:
    first and second buffer stages having respective current conduction paths for asserting a second signal at a second node as a function of the first signal; and
    an enabling element for selectively enabling the second buffer stage in response to assertion of an enabling signal in a state where the first and second buffer stages are both simultaneously enabled;

wherein the first buffer stage has at least one hysteresis feedback path from the second node for providing hysteresis in the response of the second signal to the first signal; and wherein the response of the second buffer stage to the first signal, when enabled, is faster than the response of the first buffer stage.

10. The buffer of claim 9, wherein the first node is connected to an input/output (I/O) pad, and the buffer has a second enabling element for selectively enabling the first and second buffer stages in response to assertion of a second enabling signal.

11. The buffer of claim 9, wherein the first and second buffer stages comprise pairs of transistors of first and second complementary conductivity types, and wherein the transistors of the second buffer stage of each conductivity type are larger than the transistors of the first buffer stage of the same conductivity type.

12. A buffer for providing a buffer output signal as a function of a first signal at a first node from an external source, the buffer comprising:

first and second buffer stages having respective current conduction paths for asserting a second signal at a second node as a function of the first signal; and an enabling element for selectively enabling the second buffer stage in response to assertion of an enabling signal in a state where the first and second buffer stages are both simultaneously enabled;

wherein the first buffer stage has at least one hysteresis feedback path from the second node for providing hysteresis in the response of the second signal to the first signal;

wherein the buffer presents a hysteresis that is smaller when the first and second buffer stages are both enabled than when the first buffer stage is enabled and the second buffer stage is disabled; and wherein the response of the second buffer stage to the first signal, when enabled, is faster than the response of the first buffer stage.

13. The buffer of claim 12, wherein the first node is connected to an input/output (I/O) pad, and the buffer has a second enabling element for selectively enabling the first and second buffer stages in response to assertion of a second enabling signal.

14. The buffer of claim 13, wherein:

the enabling elements comprise switches controlled by the enabling signals and connected in series with the current conduction paths of the first and second buffer stages, and the enabling element for selectively enabling the second buffer stage is connected in series between the current conduction path of the second buffer stage and the second enabling element.

15. The buffer of claim 12, wherein:

the first and second buffer stages comprise first and second logic inverters respectively, and power supply rails at different voltages, each of the inverters has first and second complementary legs connected in series in the current conduction paths between the second node and respective power supply rails, and each of the inverters has pairs of transistors of first and second complementary conductivity types connected in series in the first and second legs respectively to conduct current, the complementary pairs of transistors being controlled by the first signal.

16. The buffer of claim 15, wherein:

the first inverter has at least two complementary pairs of the transistors connected to conduct current in series in the legs of the first inverter, with transistors of the first and second conductivity types connected together in series in the first and second legs at first and second feedback nodes respectively, and the hysteresis feedback path comprises first and second biasing elements for biasing the first and second feedback nodes respectively as complementary functions of the second signal.

17. The buffer of claim 15, wherein:

the enabling element for selectively enabling the second buffer stage comprises first complementary switches controlled by the enabling signal and connected in series in the first and second legs of the second inverter, wherein the first node is connected to an input/output (I/O) pad, and the buffer has second complementary switches controlled by a second enabling signal and connected in series with both the current conduction paths of the first and second buffer stages for selectively enabling the first and second buffer stages in response to assertion of the second enabling signal.

18. The buffer of claim 12, wherein the first and second buffer stages comprise pairs first and second complementary conductivity type transistors, wherein the transistors of the second buffer stage of each conductivity type are larger than the transistors of the first buffer stage of the same conductivity type.

19. The buffer of claim 12, wherein the hysteresis feedback path of the first buffer stage provides hysteresis of the buffer when both the second buffer stage and the first buffer stage are enabled.

20. The buffer of claim 12, further comprising an inverter connected to the second node that provides the buffer output signal as a function of the second signal.

* * * * *